United States Patent
Wong (10) Patent No.: US 6,940,318 B1
(45) Date of Patent: Sep. 6, 2005

(54) ACCURATE VOLTAGE COMPARATOR WITH VOLTAGE-TO-CURRENT CONVERTERS FOR BOTH REFERENCE AND INPUT VOLTAGES

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 29 days.

(21) Appl. No.: 10/605,534

(22) Filed: Oct. 6, 2003

(51) Int. Cl.[7] .......................................... H03K 5/153
(52) U.S. Cl. ............................. 327/77; 327/78; 327/83
(58) Field of Search ......................... 327/50, 51, 68, 327/70, 77, 78, 143, 539, 83, 80, 81, 512, 327/513; 323/313, 315; 374/170, 181, 182, 374/183

(56) References Cited

U.S. PATENT DOCUMENTS

| | | | |
|---|---|---|---|
| 4,354,122 A | 10/1982 | Embree et al. | 327/103 |
| 4,734,654 A | 3/1988 | Fernandez | 330/277 |
| 4,942,369 A | 7/1990 | Nakagawara et al. | 330/296 |
| 5,519,310 A | 5/1996 | Bartlett | 323/316 |
| 5,619,125 A | 4/1997 | Lakshmikumar | 323/315 |
| 5,694,072 A | 12/1997 | Hsiao et al. | 327/537 |
| 5,739,678 A | 4/1998 | Nagaraj | 323/268 |
| 5,754,039 A | 5/1998 | Nishimura | 323/315 |
| 5,815,012 A | 9/1998 | Rivoir et al. | 327/103 |
| 5,825,167 A | 10/1998 | Ryat | 323/312 |
| 5,942,921 A * | 8/1999 | Talaga, Jr. | 327/77 |
| 6,414,536 B1 | 7/2002 | Chao | 327/540 |
| 6,586,984 B1 * | 7/2003 | Radke | 327/77 |
| 6,605,998 B2 | 8/2003 | Kimura | 330/257 |
| 6,661,713 B1 * | 12/2003 | Kuo | 327/539 |

* cited by examiner

*Primary Examiner*—Long Nguyen
(74) *Attorney, Agent, or Firm*—Stuart T. Auvinen (57) ABSTRACT

A stable voltage that is independent of supply voltage is applied to a pair of current sources. A first current source generates a first current that passes through a first resistor, setting a compare-in-put voltage. A source-input voltage is applied to the first current source to vary the first current and the compare-input voltage. A second current source generates a stable current that passes through a second resistor, setting a reference voltage. The compare-input voltage and the reference voltage are applied to inputs of a comparator that generates an output voltage that indicates when the source-input voltage causes the compare-input voltage to rise past the reference voltage. The first and second currents track each other over temperature and process variations and are independent of supply voltage. A more accurate comparison of the source-input voltage is thus made.

11 Claims, 6 Drawing Sheets

FIG. 1

PRIOR ART

FIG. 2

PRIOR ART

ACCURATE VOLTAGE COMPARATOR WITH VOLTAGE-TO-CURRENT CONVERTERS FOR BOTH REFERENCE AND INPUT VOLTAGES

BACKGROUND OF INVENTION

This invention relates to comparator circuits, and more particularly to voltage-to-current converters.

Semiconductor chips such as complementary metal-oxide-semiconductor (CMOS) integrated circuits (IC's) sometimes perform voltage-sensing. An input voltage from some source is sensed to generate an output voltage. A voltage comparator is often used to sense the input voltage. The voltage comparator compares the input voltage to a reference voltage and generates the output voltage in a high state when the high state when the input voltage is higher than the reference voltage, and generates the output voltage in a low state when the high state when the input voltage is less than the reference voltage.

Figure 1:
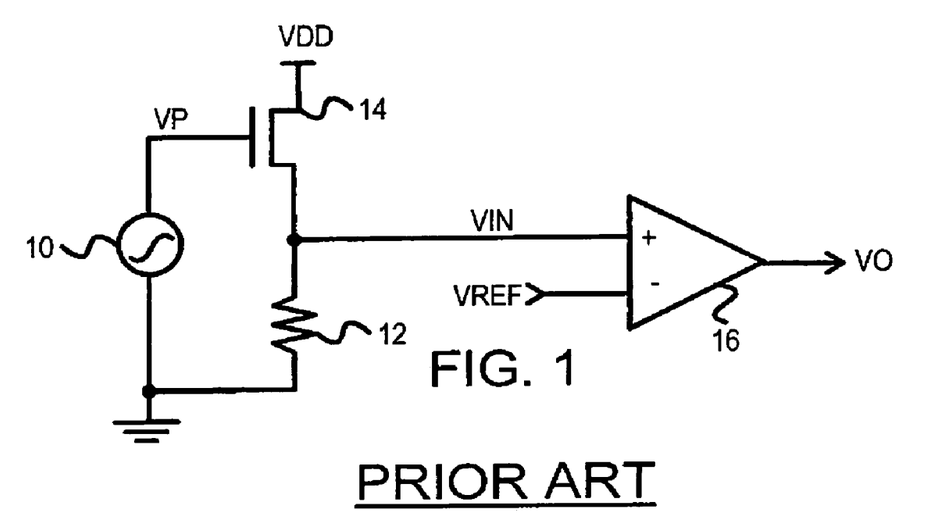
FIG. 1 shows a typical voltage-sensing circuit with a source follower and an operational amplifier.

FIG. 1 shows a typical voltage-sensing circuit with a source follower and an operational amplifier. Input source 10 is an internal or external voltage source that generates voltage Vp which is applied to the gate of n-channel transistor 14. Input voltage Vin is generated from voltage Vp using a voltage source follower that includes n-channel transistor 14 and resistor 12 in series.

N-channel transistor 14 and resistor 12 in series form a source follower between the positive voltage supply Vdd and ground. Operational amplifier or comparator 16 is configured as a non-inverting comparator. Reference voltage Vref is a reference voltage connected to the negative input of comparator 16. Input voltage Vin is connected to the positive (non-inverting) input (+) of comparator 16.

When voltage source 10 is changing from low to high, Vin follows Vp from low to high. As Vin rises to a voltage potential greater than Vref, the output Vo of comparator 16 switches from a low voltage to a high voltage. When Vin drops below the reference voltage Vref, the output Vo of comparator 16 switches from a high voltage to a low voltage.

In the circuit of FIG. 1, Vin always follows Vp as the input voltage source changes. N-channel transistor 14 acts as a source-follower that level-shifts Vp to generate input voltage Vin. Voltage Vp from input source 10 activates n-channel transistor 14, level-shifting Vin by a the gate-to-source voltage Vgs of at least a threshold Vt to be at a lower voltage than Vp.

The actual threshold voltage value of Vt varies due to changes in operating conditions such as voltage-supply, temperature, and fabrication process. As the voltage shift across n-channel transistor 14 changes with conditions, the cross-over point of Vin and Vref also changes with operating conditions. As a result, the point at which Vp is detected and output Vo switches can vary and is not accurate.

Figure 2:
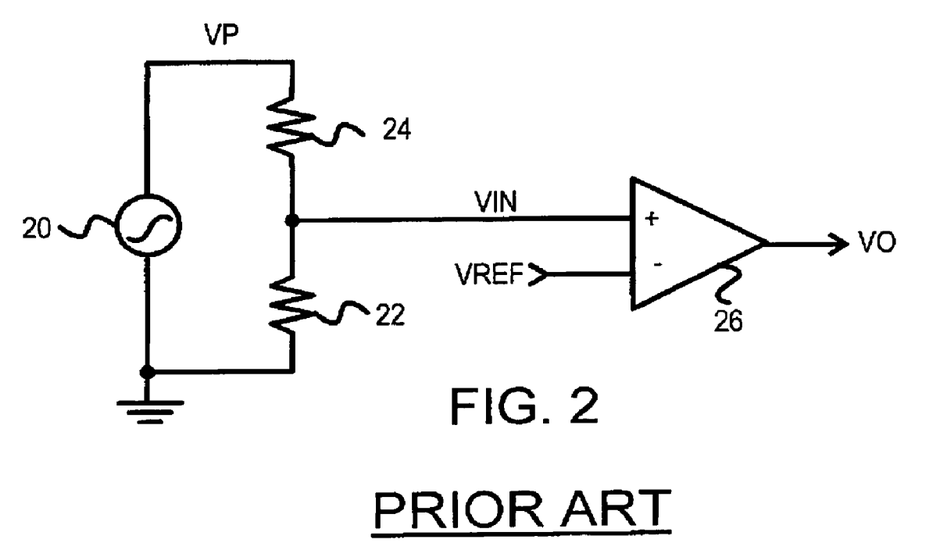
FIG. 2 shows a comparator with a resistor voltage divider.

FIG. 2 shows a comparator with a resistor voltage divider. Resistors 24, 22 are in series between voltage Vp and ground, and generate input voltage Vin at their mid-point. When input source 20 causes voltage Vp to change from low to high, Vin follows Vp from low to high. As Vin rises to a potential greater than Vref, the output Vo of comparator 26 switches from a low voltage to a high voltage. When Vin drops below the Vref voltage value, the output Vo of comparator 26 switches from a high voltage to a low voltage.

The resistor voltage divider of resistors 24, 22 act as a voltage level shifter. Resistor voltage dividers are not affected as significantly as transistors by different operating conditions such as changes in temperature, fabrication process, and varying levels of supply voltage Vdd. The circuit of FIG. 2 has an input voltage Vin that more accurately follows changes in Vp. However, such voltage dividers consume power. The current available from input source 20 may be too weak to power a voltage divider so this circuit is not a good solution for some applications.

Comparator output Vo switches polarities when Vin rises or falls past the Vref voltage value. However, this method of sensing input voltages is not accurate due to variables that affect the comparator circuitry, such as process, temperature, supply voltage, and operating frequency. Accuracy may be worse when the input voltage is double or triple the device power supply Vdd. In this case the reference voltage Vref and input voltage Vin do not track each other as accurately, causing output signal Vo to switch polarities at different voltage cross-points.

What is desired is a more accurate voltage sensor. A circuit that more accurately compares an input voltage to a reference voltage is desired.

DETAILED DESCRIPTION

The present invention relates to an improvement in voltage sensors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a better method of detecting changes to input voltages is to detect changing input currents that are independent of the supply voltage. Currents for the input and the reference can track each other as changes due to temperature, process, or supply voltage occur. Thus changes from temperature, process, and supply tend to cancel out in the two currents.

Figure 3:
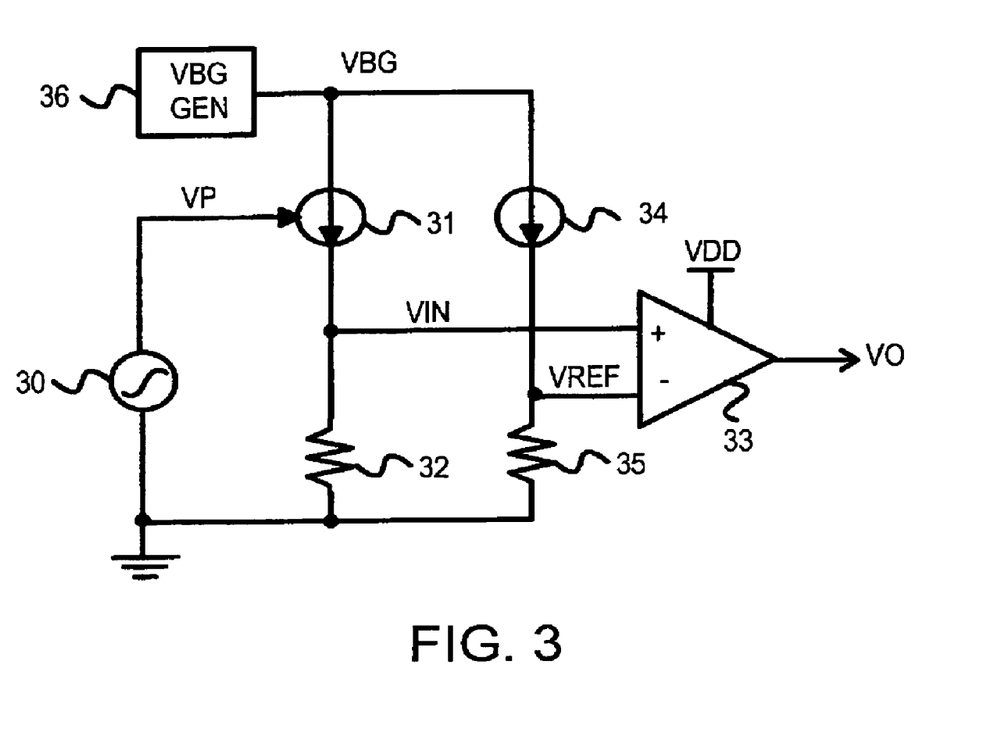
FIG. 3 is a comparator circuit with matched current for an input and a reference.

FIG. 3 is a comparator circuit with matched current for an input and a reference. Voltage generator 36 can be a band-gap reference voltage or a pad that receives a stable voltage. Voltage generator 36 outputs a relatively constant voltage Vbg to supply power to current sources 31, 34. The currents flowing through current sources 31, 34 are thus independent of the circuit power supply voltage Vdd.

Each branch acts as a voltage-to-current (V2C) converter. Input voltage Vp is converted to a first current through current source 31 and resistor 32. This first current sets Vin. The stable voltage Vbg, or another stable voltage such as ground, is converted to a second current flowing through current source 34 and resistor 35. This second current sets Vref. Both the first and second currents are independent of supply voltage Vdd, since current sources 31, 34 are connected to voltage Vbg.

Current flows from current sources 31, 34 through resistors 32, 35 to ground. Input voltage Vin to the non-inverting (+) input of comparator 33 is generated between current source 31 and resistor 32, while reference voltage Vref to the inverting (−) input of comparator 33 is generated between current source 34 and resistor 35. Vref is a fixed voltage because the current flowing through resistor 35 from current source 34 remains relatively constant.

Input voltage Vp from input source 30 controls current source 31. When Vp changes from a low voltage to a high voltage, the current generated by current source 31 increases from a low value to a higher value. The current flowing through resistor 32 induces a voltage potential Vin on the positive input of comparator 33. Input voltage Vin follows Vp, changing from low to high and from high to low but at a voltage value lower than Vp. When Vin increases to a voltage greater than Vref, the output Vo of comparator 33 switches from a low voltage to a high voltage. When Vin decreases to a voltage less than Vref, the output Vo of comparator 33 switches from a high voltage to a low voltage.

There are two equal current branches that are constant current sources. Current source 31 and resistor 32 form one branch while current source 34 and resistor 35 form the other branch. Each branch is designed with the same circuit scheme and same type of components. The voltage parameters of these two branches track each other as temperature and fabrication process change. As circuit conditions vary due to temperature or process, the voltage-sensitive parameters on each input to comparator 33 drift up or down together in the same direction. Using constant current sources allows this circuit to sense input voltage Vp more accurately. Two implementations of the constant current sources and the voltage sensing circuitry are illustrated in more detail in FIG. 4 and FIG. 5.

Figure 4:
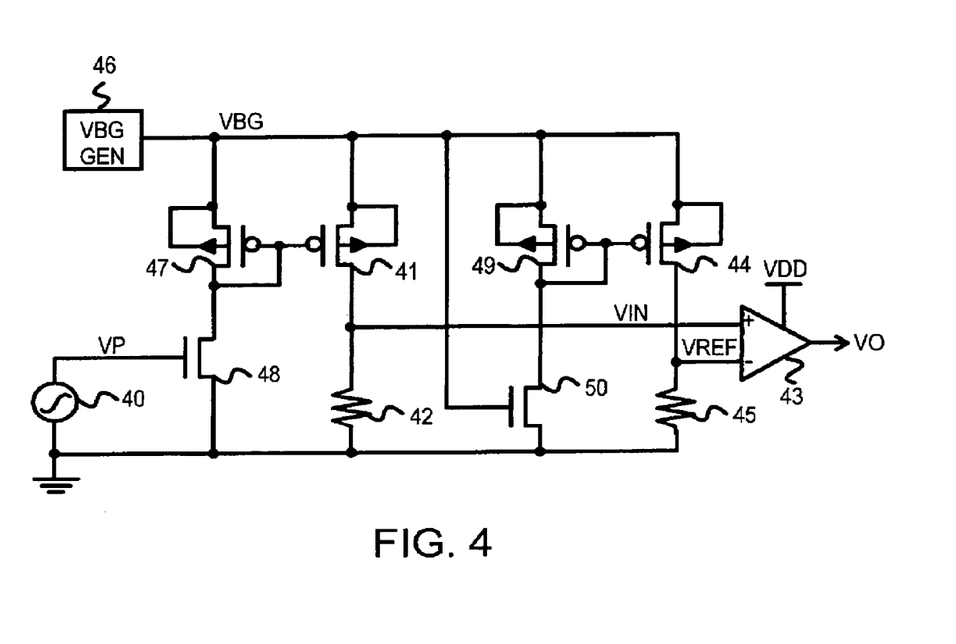
FIG. 4 shows two branches of current-mirrored currents to a comparator.

FIG. 4 shows two branches of current-mirrored currents to a comparator. One branch of the constant current source includes p-channel transistors 49, 44 and n-channel transistor 50. P-channel transistor 44 has its gate connected to the gate and drain of p-channel transistor 49 to mirror the current through transistors 49, 50. The drain of p-channel transistor 44 outputs reference voltage Vref and supplies current to resistor 45 to generate Vref.

The other branch of the constant current source includes p-channel transistors 47, 41 and n-channel transistor 48, which supply current to resistor 42 to generate input voltage Vin. Current through p-channel transistor 47 is mirrored to p-channel transistor 41.

These two branches have the same functions as described in FIG. 3. Constant voltage generator 46 supplies voltage Vbg to the source and N-well of p-channel transistors 47, 41, 49, 44. The gate of n-channel transistor 50 in the reference branch is also connected to constant voltage Vbg.

The two current-source pairs (p-channel transistors 47, 41 and 49, 44) in FIG. 4 operate in a similar manner. Input voltage Vp from input source 40 is applied to the gate of n-channel transistor 48, increasing or decreasing its current drive or transconductance as the gate voltage Vp changes.

The input current source pair of p-channel transistors 47, 41 remain at a higher impedance as long as n-channel transistor 48 is off or conducting a low current.

When Vp rises from a low to a higher voltage, n-channel transistor 48 turns on more strongly and more current begins to flow through p-channel transistor 47 and this increased current is mirrored to p-channel transistor 41 since they share gate-to-source voltages. As Vp rises, p-channel transistor 41 outputs a larger current that flows through resistor 42 and generates a higher Vin. Thus the voltage value of Vin follows changes to input voltage Vp but at a lower value than Vp. When Vin rises above the value of Vref, the output Vo of comparator 43 switches from a low voltage (or ground) to a higher voltage. The current source pair of p-channel transistors 49, 44 generates a continuous output current that flows through resistor 45 to create a constant Vref.

The source of power, band-gap voltage Vbg, for these elements is independent of the power supply voltage Vdd. Since Vbg is constant, reference currents from p-channel transistors 47, 41, 49, and 44 are also constant. Each of these current sources are made of the same type of components and circuit scheme so they will operate in exactly the same way under difference operating conditions. Resistors 42, 45 are made of the same type of material so temperature changes of the resistors do not affect the relative value of Vin and Vref. When variances in temperature or fabrication process cause circuit parameters to drift, the output from these circuits drifts up or down together. The result is that Vin and Vref always track one another regardless of temperature or process variations.

Figure 5:
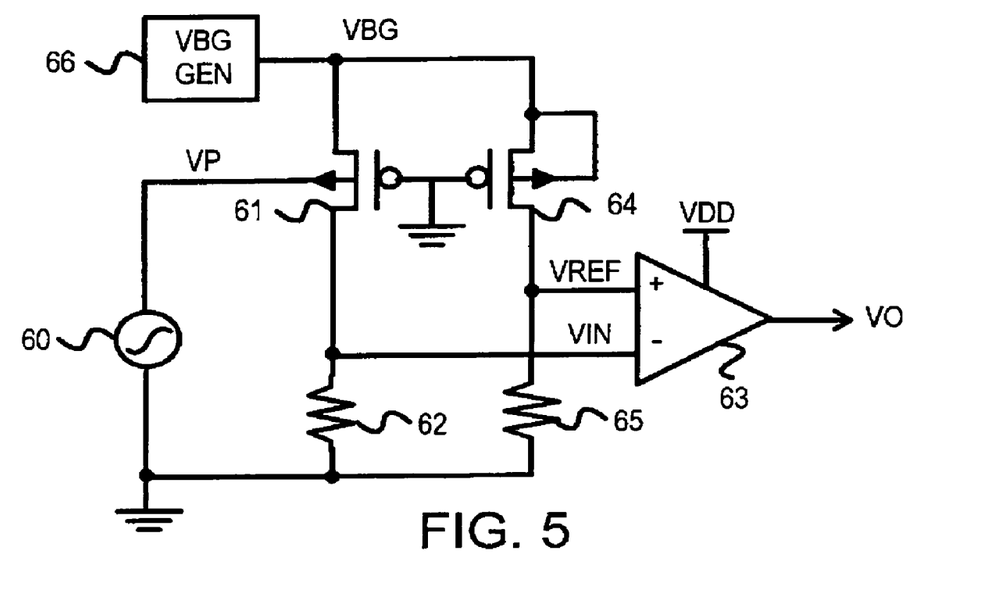
FIG. 5 is a circuit that uses a substrate connection to sense the input voltage.

FIG. 5 is a circuit that uses a substrate connection to sense the input voltage. This version of the circuit scheme described in FIG. 3 takes advantage of the body effect (Substrate Bias Effect) of a MOSFET. In this example the current source branches of the circuit are connected to different inputs of comparator 63. The reference current source has p-channel transistor 64 that supplies current that flows through resistor 65 to produces the constant reference voltage Vref at the drain of p-channel transistor 64. Reference voltage Vref is connected to the non-inverting (positive) input of comparator 63. A second current source has p-channel transistor 61 that supplies current flowing through resistor 62 to generate input voltage Vin. Vin is connected to the inverting (negative) input of comparator 63.

Input voltage Vp is generated from input source 60 and is connected to the bulk node or N-well substrate contact of p-channel transistor 61. Due to the body effect characteristic the circuit in FIG. 5 operates inversely to the circuit described in FIG. 4. When input voltage Vp changes from low to high, the threshold voltage of p-channel transistor 61 increases (becomes more negative). This causes the current flow through p-channel transistor 61 and resistor 62 to decrease, which lowers the voltage level of Vin. When Vin becomes lower than the value of Vref, the output Vo of comparator 63 switches from a low voltage to a high voltage.

When input voltage Vp changes from high to low, the threshold of p-channel transistor 61 decreases (absolute value becomes smaller) and the current flow through p-channel transistor 61 and resistor 62 increases. When this occurs, Vin increases to a value greater than Vref and the output Vo of comparator 63 switches back to a low voltage.

The reference current source has p-channel transistor 64 with its gate connected to ground and its source and N-well substrate connected to constant voltage Vbg. Because voltage generator 66 is independent of the supply voltage Vdd, the current through the p-channel current sources is constant. Vref and Vin track one another in the same direction even if there are changes in circuit parameters due to variances in operating temperature or fabrication process. Since resistors 62, 65 use the same type of material, the ratio of these two resistors remains the same regardless of temperature or fabrication process changes. These factors permit the values of Vin and Vref to consistently drift proportionally in the same direction so that the value of Vp is sensed accurately. The value of Vbg is about 2.5v, or 0.5v below the minimum Vdd=3v, in one example.

Figure 6:
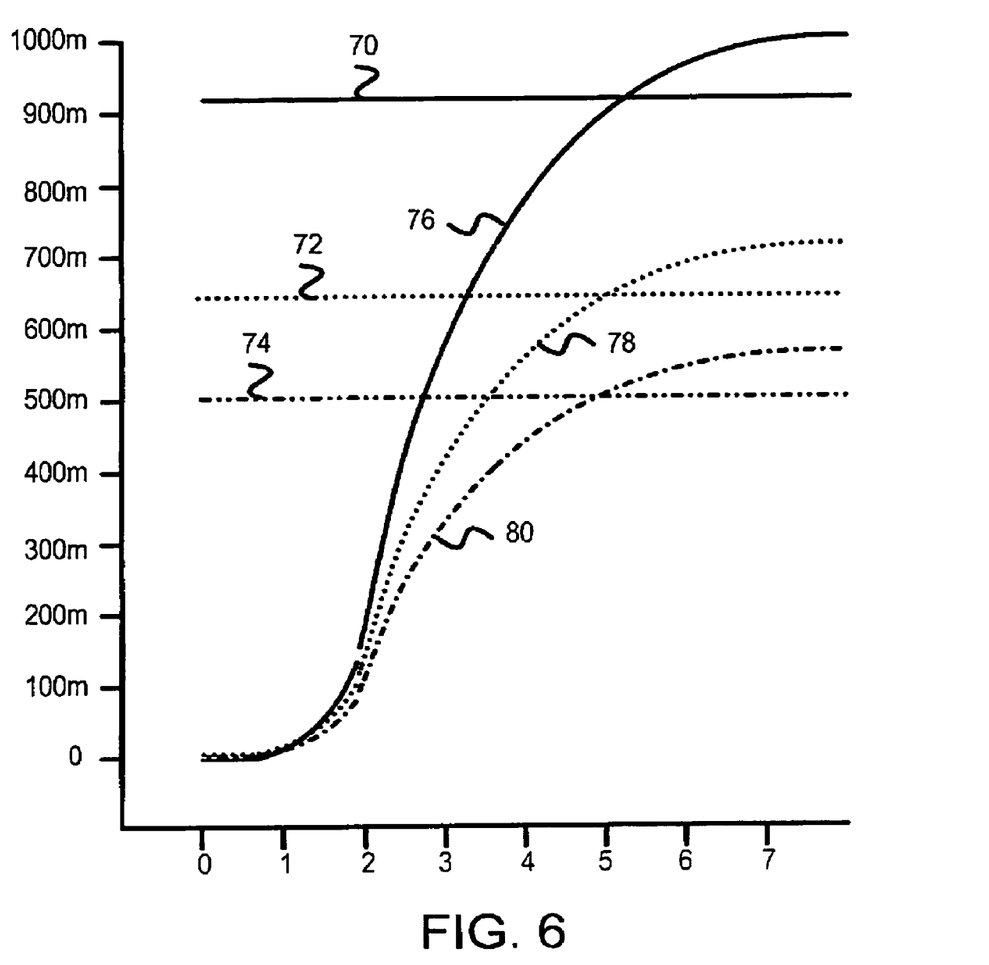
FIG. 6 is a graph of Vin and Vref for the circuit of FIG. 4.

FIG. 6 is a graph of Vin and Vref for the circuit of FIG. 4. The x-axis shows voltage Vp while the y-axis shows voltages of Vref and Vin as Vp is swept from ground to 7 volts.

At room temperature and with a typical process, reference voltage Vref2 is set at about 0.64 volt, as shown by horizontal line 72. When Vp is swept from 0 to 7v, input voltage Vin2 (curve 78) follows Vp and rises from 0 to about 0.72v. The cross-over point of line 72 and curve 78 is at Vp=5v. Once Vin2 crosses over this point, comparator 43 switches and drives output signal Vo high.

At low temperature such as at 40 degrees C. and best process conditions, both reference voltage Vref1 (line 70, about 0.91v) and input voltage Vin1 (curve 76) drift upward. The cross-over point is at Vp=5.2v, which is just 4% higher than the typical value (intersection of line 72 and curve 78). At high temperature (85 degree C.) and worst process conditions, both reference voltage Vref3 (line 74, about 0.48v) and input voltage Vin3 (curve 80) are drifting down, keeping the cross-over point of line 74 and curve 80 at Vp=4.9v which is only 2% lower than its typical value. Thus the range of cross-over points is from 4.9 to 5.2 volts (within +/−4%) as temperature and process are varied.

Figure 7:
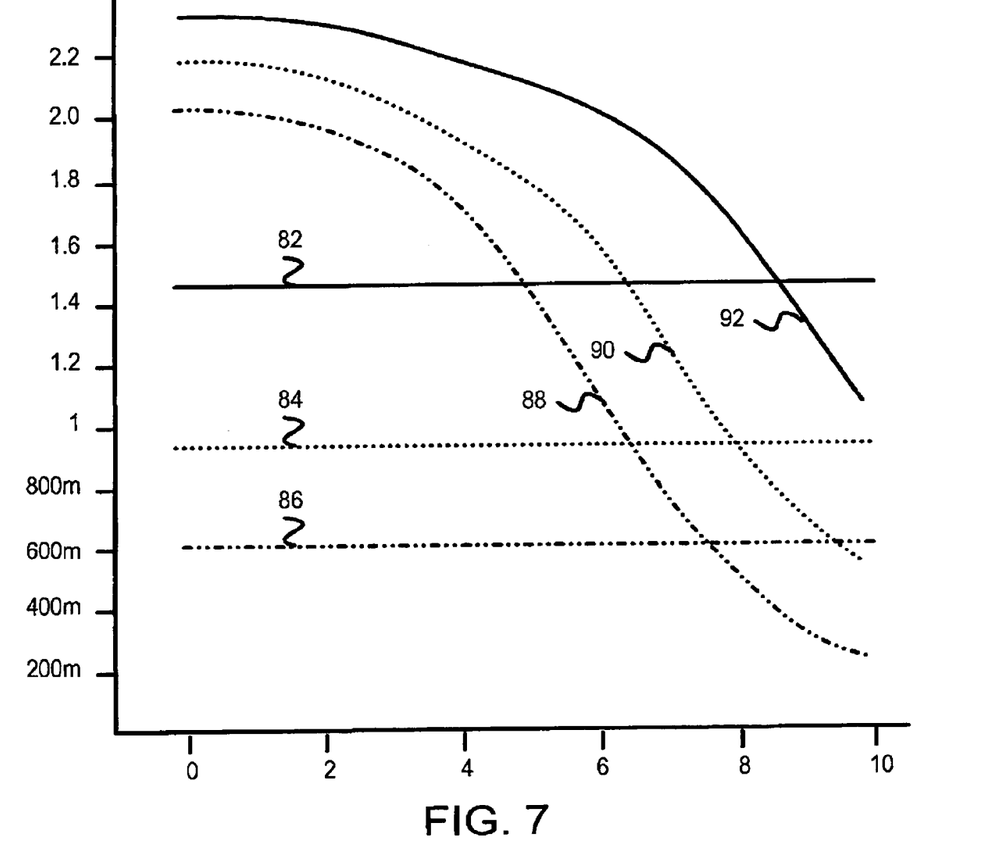
FIG. 7 is a graph of Vin and Vref for the circuit of FIG. 5.

FIG. 7 is a graph of Vin and Vref for the circuit of FIG. 5. The x-axis shows voltage Vp while the y-axis shows voltages of Vref and Vin as Vp is swept from ground to 10 volts.

At room temperature and with a typical process, reference voltage Vref2 is set at about 0.92 volt, as shown by horizontal line 84. When Vp is swept from 0 to 7v, input voltage Vin2 (curve 90) decreases from 2.2 volts to about 0.5v. The cross-over point of line 84 and curve 90 is at Vp= 8v. Once Vin2 crosses over this point, comparator 63 switches and drives output signal Vo high.

At low temperature such as at 40 degrees C. and best process conditions, both reference voltage Vref1 (line 82, about 1.46v) and input voltage Vin1 (curve 92) drift upward. The cross-over point is at Vp=8.6v, which is 7.5% higher than the typical value (intersection of line 84 and curve 90). At high temperature (85 degree C.) and worst process conditions, both reference voltage Vref3 (line 86, about 0.6v) and input voltage Vin3 (curve 88) are drifting down, keeping the cross-over point of line 86 and curve 88 at Vp=7.6v which is only 5% lower than its typical value. Thus the range of cross-over points is from 7.6 to 8.6 volts (within +/−8%) as temperature and process are varied.

ALTERNATE EMBODIMENTS

Several other embodiments are contemplated by the inventor. For example the two branches can use the same size devices or could use different sizes to adjust the cross-over voltage points. Transistors may have several legs or may have unusual geometries such as doughnut rings. Resistors may be made from N-well, polysilicon, or other resistive material. A variety of circuits may be used to generate the stable voltage Vbg, such as a band-gap reference circuit. The resistors could be implemented as transistors with gates connected to a fixed bias voltage or connected as a diode (gate and drain tied together). The substrate or bulk node could be an N-well or a P-well with a n-type substrate or region such as an oxide-isolated n-type tub.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A voltage sensor circuit comprising:
    a source-input node having a source-input voltage that is varied by a voltage source, the voltage sensor circuit sensing the source-input voltage of the source-input node;
    a first current source, responsive to the source-input voltage, for generating a first current that varies with variations in the source-input voltage;
    a first resistor, coupled to the first current source and receiving the first current, for generating a compare-input voltage on a compare-input node in response to the first current, the compare-input voltage varying with variations in the first current;
    a second current source for generating a second current that is insensitive to variations in the source-input voltage;
    a second resistor, coupled to the second current source and receiving the second current, for generating a reference voltage on a reference node in response to the second current, the reference voltage varying with variations in the second current;
    a stable node, coupled to the first current source and coupled to the second current source, the stable node having a stable voltage that is relatively insensitive to changes in a supply voltage;
    a comparator coupled to the compare-input node and the reference node, for comparing the compare-input voltage to the reference voltage and generating an output voltage at an output node that indicates when the compare-input voltage is above the reference voltage;

wherein the first current source comprises:

a first mirror transistor having a channel that conducts the first current between the stable node and the compare-input node in response to a first gate node;

a first setting transistor, with a gate connected to the first gate node, having a channel that conducts a first setting current between the stable node and the first gate node;

a first sensing transistor having a channel that conducts a portion of the first setting current from the first gate node, the first sensing transistor having a gate connected to the source-input voltage;

wherein the second current source comprises:

a second mirror transistor having a channel that conducts the second current between the stable node and the reference node in response to a second gate node;

a second setting transistor, with a gate connected to the second gate node, having a channel that conducts a second setting current between the stable node and the second gate node; and a second sensing transistor having a channel that conducts a portion of the second setting current from the second gate node, the second sensing transistor having a gate connected to a fixed voltage.

2. The voltage sensor circuit of claim 1 wherein the fixed voltage applied to the gate of the second sensing transistor is the stable voltage.

3. The voltage sensor circuit of claim 2 wherein the first and second mirror transistors and the first and second setting transistors are p-channel transistors;

wherein the first and second sensing transistors are n-channel transistors.

4. The voltage sensor circuit of claim 3 wherein a cross-over voltage of the source-input voltage that causes the output voltage to change states varies less than +/−4% over a temperature range from −40 to +85 degrees C.

5. The voltage sensor circuit of claim 1 further comprising:

a voltage generator for generating the stable voltage on the stable node that is independent of the supply voltage to the comparator.

6. The voltage sensor circuit of claim 5 wherein the voltage generator is a band-gap voltage generator.

7. The voltage sensor circuit of claim 6 wherein the comparator is powered by the supply voltage.

8. A temperature-insensitive voltage sensor comprising:

an input voltage from a varying voltage source;

compare means, having a first input and a second input, for comparing voltages on the first and second inputs to generate an output;

first resistor means, receiving a first current, for generating a compare voltage on the first input of the compare means;

first mirror transistor means, having a gate connected to a first gate node, for generating the first current from a stable node to the first input of the compare means and to the first resistor means;

first current-source transistor means, having a gate and a drain connected to the first gate node and a source connected to the stable node, for generating a first gate voltage on the first gate node;

first sensing transistor means, having a gate driven by the input voltage, for varying a first sink current from the first gate node in response to the input voltage;

second resistor means, receiving a second current, for generating a reference voltage on the second input of the compare means;

second mirror transistor means, having a gate connected to a second gate node, for generating the second current from the stable node to the second input of the compare means and to the second resistor means;

second current-source transistor means, having a gate and a drain connected to the second gate node and a source connected to the stable node, for generating a second gate voltage on the second gate node; and second sensing transistor means, having a gate driven by a constant voltage, for generating a second sink current from the second gate node.

9. The temperature-insensitive voltage sensor of claim 8 further comprising:

stable-voltage generator means for generating a stable voltage on the stable node, the stable voltage being insensitive to a supply voltage to the compare means.

10. The temperature-insensitive voltage sensor of claim 9 wherein the first and second sensing transistor means are n-channel transistors having grounded sources;

wherein the first and second mirror transistor means are p-channel transistors having sources connected to the stable node;

wherein the first and second current-source transistor means are p-channel transistors having sources connected to the stable node and each having a drain shorted to a gate.

11. The temperature-insensitive voltage sensor of claim 10 wherein the constant voltage to the gate of the second sensing transistor means is the stable voltage.

* * * * *